US007061963B2

(12) United States Patent
Takemi et al.

(10) Patent No.: US 7,061,963 B2
(45) Date of Patent: Jun. 13, 2006

(54) SEMICONDUCTOR LASER DEVICE

(75) Inventors: Masayoshi Takemi, Tokyo (JP); Toru Ota, Tokyo (JP); Shiro Ryochiku, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 301 days.

(21) Appl. No.: 10/421,797

(22) Filed: Apr. 24, 2003

(65) Prior Publication Data

US 2004/0057483 A1    Mar. 25, 2004

(30) Foreign Application Priority Data

Sep. 24, 2002  (JP) .............................. 2002-277394

(51) Int. Cl.
*H01S 3/08*   (2006.01)
*H01S 5/00*   (2006.01)

(52) U.S. Cl. ...................... 372/96; 372/45.01; 372/102
(58) Field of Classification Search ................. 372/96, 372/45, 43, 45.01, 102
See application file for complete search history.

(56) References Cited

U.S. PATENT DOCUMENTS 5,023,198 A * 6/1991 Strege ........................ 438/32
5,327,450 A * 7/1994 Fujii ........................... 372/96
6,376,338 B1 * 4/2002 Ekawa et al. ............... 438/478

FOREIGN PATENT DOCUMENTS

JP          11-274642       10/1999

OTHER PUBLICATIONS

"The Effects of Dopant on InP Selective Growth by MOVPE", by NTT Opto-electronics Laboratories, Y. Kondo and Y. Imamura, no date.
"Metalorganic vapor-phase epitaxial regrowth of InP on reactive ion-etched mesa structures for p-substrate buried heterostructure laser application", By M. Takemi et al., Journal of Crystal Growth 180, 1997 pp. 1-8.
"Improved Selective Growth of InP Around Dry-Etched Mesas by Metalorganic Chemical Vapor Deposition at Low Growth Temperature", By M. Takemi et al., J. Electoric Materials, vol. 25, No. 3, 1996 pp. 369-374.

* cited by examiner

*Primary Examiner*—James Menefee
(74) *Attorney, Agent, or Firm*—Leydig, Voit & Mayer, Ltd.

(57) ABSTRACT

A semiconductor laser device includes an n type diffraction grating layer of n-InGaAsP on an n-InP substrate, and having through-holes periodically disposed alongside of one another in a laser optical waveguide direction, an n-InP layer containing S as a dopant impurity in a concentration of at least $1\times10^{19}$ cm$^{-3}$. The through holes are buried in the n-InP layer, and an active layer is disposed on both the n-InP layer and the diffraction grating layer through an n-InP cladding layer.

4 Claims, 9 Drawing Sheets

SEMICONDUCTOR LASER DEVICE

FIELD OF THE INVENTION

The present invention relates to the field of semiconductor laser devices used for optical communications, etc., and more particularly to the structure of a diffraction grating for distributed feedback semiconductor laser devices.

DESCRIPTION OF THE RELATED ART

With the spread of public networks using optical fibers, there is an increasing need to transmit a large amount of information at low cost. Increasing the amount of information that can be transmitted so as to meet such a need requires high-speed modulation of laser light. For high-speed modulation of laser light, external modulation systems have become generally used in which a DC-driven single mode semiconductor laser is combined with an optical modulator.

Even though the systems can be configured such that the semiconductor laser and the optical modulator are formed independently of each other, a configuration in which the semiconductor laser and the optical modulator are integrated has become increasingly used since it can eliminate the need for employing an optical system between the semiconductor laser and the optical modulator.

In this configuration (a semiconductor laser with an optical modulator attached thereto), a relatively simple absorption type optical modulator and a distributed feedback semiconductor laser (hereinafter referred to as a DFB laser) are used as the optical modulator and the single mode semiconductor laser, respectively.

FIG. 16 is a cross-sectional view of a conventional DFB laser. In FIG. 16, the optical guide direction is parallel to the right and left sides of the paper. FIG. 17 is a cross-sectional view of the DFB laser of FIG. 16 taken along line 17—17. In FIG. 17, the optical waveguide direction is normal to the paper. The following description explains only the semiconductor laser portion of a semiconductor laser with an optical modulator.

In FIGS. 16 and 17, reference numeral 200 denotes a DFB laser; 202 an n conductivity type InP substrate ("n conductivity type" and "p conductivity type" are hereinafter expressed as "n-" and "p-", respectively); 204 an n-InP buffer layer; 206 an active layer having a multiple quantum well structure made up of an InGaAsP quantum well layer and an InGaAsP barrier layer; 208 a p-InP cladding layer; 210 a p-InGaAsP diffraction grating layer; 210a through holes provided in the diffraction grating layer 210; 212 a p-InP burying layer for burying the through holes 210a under its burying portion 212a and covering the diffraction grating 210; 214 an Fe-doped InP (hereinafter expressed as Fe-InP) blocking layer; 216 an n-InP blocking layer; 218 a p-InGaAs contact layer; 220 a p type electrode; and 222 an n type electrode.

The manufacturing method will be described below. FIGS. 18 to 25 are each a cross-sectional view of a semiconductor laser in a manufacturing process employed by a manufacturing method of a conventional semiconductor laser.

FIGS. 18 to 21 are views of the same cross section as that shown in FIG. 16, while FIGS. 22 to 25 are views of the same cross section as that shown in FIG. 17.

Referring to FIG. 18, on the n-InP substrate 202 and by use of the MOCVD method, etc., the manufacturing method sequentially forms: an n-InP layer 230 corresponding to the n-InP buffer layer 204 (in FIG. 16); a multiple quantum well layer 232 corresponding to the active layer 206 and made up of an InGaAsP quantum well layer and an InGaAsP barrier layer; a p-InP layer 234 corresponding to the p-InP cladding layer 208; a p-InGaAsP layer 236 corresponding to the diffraction grating layer 210; and a p-InP capping layer 238. FIG. 18 shows a cross section of the semiconductor laser (chip) after it is subjected to this manufacturing process.

Then, referring to FIG. 19, after a photoresist is coated on the capping layer 238, a resist pattern 240 having opening portions 240a at appropriate intervals (for example, 100 nm) is formed by use of a photolithographic technique. FIG. 19 shows a cross section of the semiconductor laser (chip) after it is subjected to this manufacturing process.

Then, referring to FIG. 20, the capping layer 238 and the p-InGaAsP layer 236 are etched by RIE, etc. using the resist pattern 240 as a mask to form a stripe pattern in which the opening portions 210a are formed in the p-InGaAsP layer 236. After that, the resist pattern 240 is removed. FIG. 20 shows a cross section of the semiconductor laser (chip) after it is subjected to this manufacturing process.

Then, referring to FIG. 21, the opening portions 210a are buried under a p-InP layer 242 corresponding to the burying layer 212, and furthermore the capping layer 238 is also buried under the p-InP burying layer 242 through crystal growth. FIG. 21 shows a cross section of the semiconductor laser (chip) after it is subjected to this manufacturing process.

Then, referring to FIG. 22, an $SiO_2$ film 244 is formed on the p-InP layer 242 and coated with a photoresist. Subsequently, by use of a photolithographic technique, a strip-shaped resist pattern 246 is formed which extends in the optical guide direction and which has a width of 5 µm in a direction perpendicular to the optical waveguide direction. FIG. 22 shows a cross section of the semiconductor laser (chip) after it is subjected to this manufacturing process.

Then, referring to FIG. 23, the $SiO_2$ film 244 is etched by RIE using the resist pattern 246 as a mask to form an $SiO_2$ film pattern 244a. After the formation of the $SiO_2$ film pattern 244a, the resist pattern 246 is removed. FIG. 23 shows a cross section of the semiconductor laser (chip) after it is subjected to this manufacturing process.

Then, referring to FIG. 24, by use of a wet etchant such as HBr, wet etching is carried out which reaches the n-InP layer 230 through the multiple quantum well layer 232 (for example, wet etching having a depth of approximately 3.5 µm) using the $SiO_2$ film pattern 244a as a mask to form a mesa structure for confining electric current within the active layer 206. FIG. 24 shows a cross section of the semiconductor laser (chip) after it is subjected to this manufacturing process.

Then, referring to FIG. 25, an Fe-InP layer 246 and an n-InP layer 248 are formed using the $SiO_2$ film pattern 244a as a mask. Since the $SiO_2$ film pattern 244a has selectivity against InP, the Fe-InP layer 246 and the n-InP layer 248 are not formed on the $SiO_2$ film pattern 244a. Thus, the $SiO_2$ film pattern 244a functions as a selective growth mask such that the Fe-InP layer 246 and the n-InP layer 248 are laminated only around the mesa structure, forming a current constriction structure only around it. FIG. 25 shows a cross section of the semiconductor laser (chip) after it is subjected to this manufacturing process.

After the above process, the $SiO_2$ film pattern 244a is removed using a wet etchant such as HF. Then, after a p-InP layer is laminated, a p-InGaAs layer is formed as the contact layer 218, and the p type electrode 220 and the n type electrode 222 are formed, completing the configuration of the semiconductor laser 200 shown in FIGS. 16 and 17.

It has been reported that when an InP layer is formed on a wafer through a pattern formed on the wafer by use of the MOCVD method, addition of S to the InP layer at a high concentration suppresses growth of a (001)-surface having a width of approximately 0.1 µm (for example, M. Takemi et al., "Journal of Electronic Materials", 1996, Vol. 25, No. 3, pp. 369–374).

Furthermore, an arrangement has been devised in which a diffraction grating layer is formed within an n type semiconductor layer on a sapphire substrate, and an active layer having a multiple quantum well structure is formed on the diffraction grating layer (for example, Japanese Patent Laid-Open Publication No. Hei 11(1999)-274642, p. 4, FIG. 1)

When the DFB laser 200 is manufactured using the above manufacturing method, the stripe pattern in which the opening portions 210a are formed in the p-InGaAsP layer 236 corresponding to the diffraction grating layer 210 is formed, and then the opening portions 210a are buried under the p-InP layer 242 corresponding to the burying layer 212. At that time, to maintain the original shape of the opening portions 210a in the diffraction grating layer 210, the growth of the p-InP layer 242 must be initiated at a growth temperature for initial growth lower than an ordinary growth temperature of, for example, 600° C.

Since the quality of a crystal grown at a low temperature may be occasionally lower than that at an ordinary growth temperature, the temperature must be set a little low during the initial growth and then gradually increased to an ordinary growth temperature to prevent degradation of the quality of the crystal as much as possible.

In the configuration of the DFB laser 200, however, it is necessary to add Zn to the material of the p-InP layer 242 corresponding to the burying layer 212 as an impurity to produce a p type semiconductor. Zn is taken into a crystal-grown layer very efficiently at low temperature. Since the p-InP layer 242 is crystal-grown while the growth temperature is gradually increased from its initial growth value, failure to closely control the amount of Zn to be supplied tends to lead to excess or deficiency of Zn in the p-InP layer 242. Zn very easily diffuses within a crystal. Therefore, if Zn is excessively taken, it may occasionally diffuse into the active layer 206, into which it should not be included, leading to deterioration of the optical characteristics of the active layer and degradation of the DFB laser element.

Conversely, if the p-InP layer 242 corresponding to the burying layer 212 is Zn deficient occasionally, the resistivity of the p type semiconductor layer, which is inherently higher than that of the n type semiconductor layer, is further increased. As a result, the element resistance of the DFB laser element increases, resulting in deteriorated temperature characteristics of the element.

FIG. 26 is a cross-sectional view of another conventional DFB laser. In FIG. 26, the optical guide direction is parallel to the right and left sides of the paper. FIG. 27 is a cross-sectional view of the DFB laser of FIG. 26 taken along line 27—27. In FIG. 27, the optical waveguide direction is normal to the paper. The components in FIGS. 26 and 27 which are the same as or correspond to those in FIGS. 16 and 17 are denoted by like numerals. This rule is also applied to the subsequent figures.

In FIGS. 26 and 27, reference numeral 250 denotes a DFB laser; 252 an n-InGaAsP diffraction grating layer; 252a through-holes provided in the diffraction grating layer 252; 254 an n-InP burying layer for burying the through holes 252a under its burying portion and covering the diffraction grating layer 252.

In a configuration in which the diffraction grating layer 252 is provided under the active layer 206 as in the DFB laser 250, both the diffraction grating layer 252 and the n-InP burying layer 254 are set to be n-type semiconductor layers, eliminating the need for adding Zn as an impurity. Therefore, there is no possibility that Zn diffuses into the active layer 206 or the resistivity of the p type semiconductor layer further increases and high element resistance of the DFB laser element results.

However, the diffraction grating layer 252 and the active layer 206 are separated by the n-InP burying layer 254 having a thickness of approximately between 0.1 and 0.3 µm. Therefore, the formation of the n-InP burying layer 254 is affected by the surface irregularities of the diffraction grating layer 252, which may cause the surface of the n-InP burying layer 254 not to be flat. As a result, the active layer 206 formed on the n-InP burying layer 254 also may not be flat occasionally; it may undulate.

Furthermore, if the through holes 252a are formed to have a considerable depth, crystal dislocation may occur due to the surface irregularities of the diffraction grating layer 252.

SUMMARY OF THE INVENTION

The present invention has been devised to solve the above problems. It is, therefore, an object of the present invention to provide a DFB laser which includes a diffraction grating having a high coupling coefficient and a laser element exhibiting good characteristics.

According to one aspect of the invention, there is provided a semiconductor laser device comprising: an n type InP substrate; a diffraction grating layer of an n type formed on a surface of the InP substrate and made of a material which can provide lattice matching to InP and which has a refractive index different from that of InP, the n type diffraction grating layer having concave portions periodically disposed alongside of one another in a laser optical waveguide direction; an InP layer of an n type containing a VI family element as an impurity at a concentration of $1\times10^{19}$ cm$^{-3}$ or more and disposed such that the concave portions are buried in the InP layer; a first cladding layer of an n type disposed on both the InP layer and the diffraction grating layer; an active layer disposed on the first cladding layer; and a second cladding layer of a p type disposed on the active layer.

Therefore, the concave portions in the diffraction grating layer are buried in the n type InP layer, which flattens the surface of the first cladding layer, making it possible to configure the active layer such that it exhibits a reduced number of occurrences of crystal dislocation and good optical characteristics.

Accordingly, it is possible to provide a semiconductor laser which has good laser element characteristics.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

The following description explains preferred embodiments of the present invention using, for example, a DFB laser for optical communications. This DFB laser may be an individual DFB laser, or it may be the semiconductor laser portion of a semiconductor laser with an optical modulator. Either way, the following description explains only the DFB laser portion. Furthermore, the n type semiconductor layers described below contain S as a VI-family element impurity. However, Se may be used as the impurity.

First Embodiment

Figure 1:
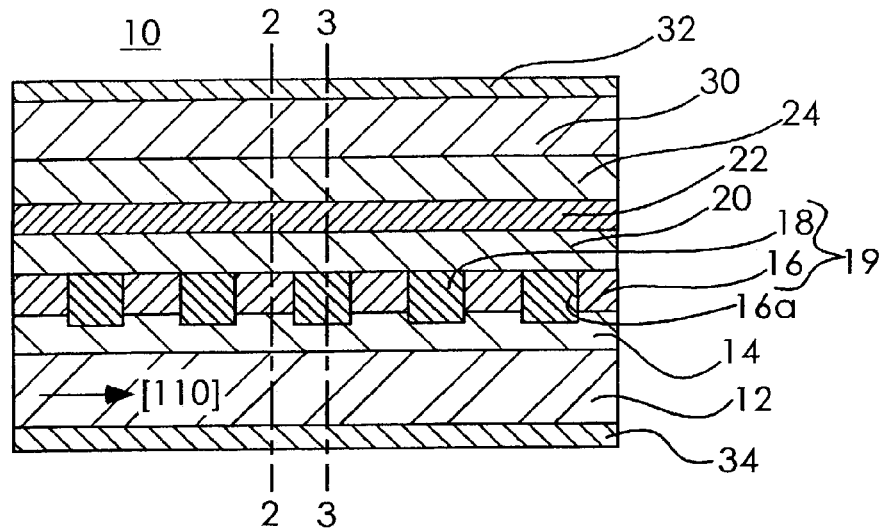
FIG. 1 is a cross-sectional view of a semiconductor laser according to one embodiment of the present invention.
Figure 2:
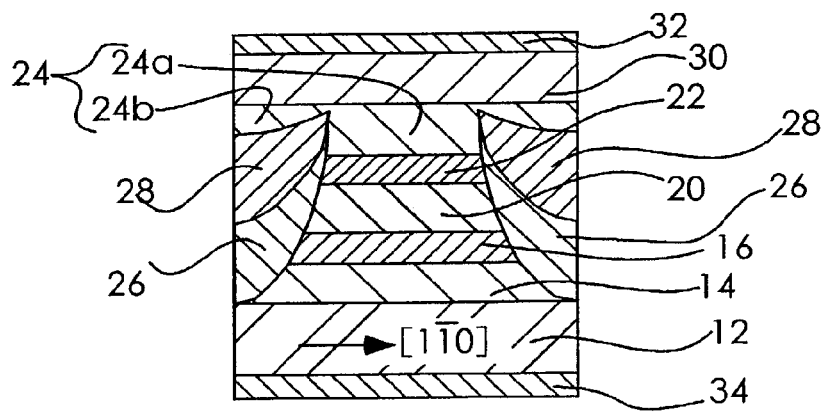
FIG. 2 is a cross-sectional view of the semiconductor laser of FIG. 1 taken along line 2—2.
Figure 3:
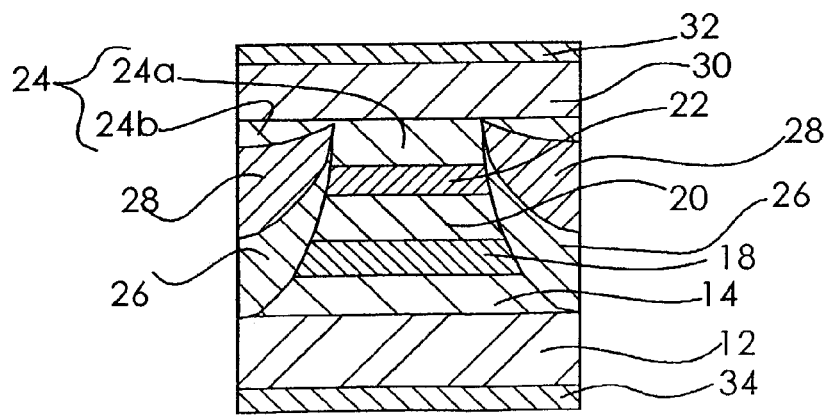
FIG. 3 is a cross-sectional view of the semiconductor laser of FIG. 1 taken along line 3—3.

FIG. 1 is a cross-sectional view of a semiconductor laser according to a first embodiment of the present invention. In FIG. 1, the optical waveguide direction is parallel to the right and left sides of the paper. FIG. 2 is a cross-sectional view of the semiconductor laser of FIG. 1 taken along line 2—2, while FIG. 3 is a cross-sectional view of the semiconductor laser of FIG. 1 taken along line 3—3. In FIGS. 2 and 3, the optical waveguide direction is normal to the paper.

In FIGS. 1, 2, and 3, reference numeral 10 denotes a DFB laser. Reference numeral 12 denotes an n-InP substrate. The arrow drawn in the n-InP substrate 12 in FIG. 1 indicates the [110] direction, while the arrow drawn in the n-InP substrate 12 in FIG. 2 indicates the [1 1(with an upper bar) 0] direction. Accordingly, the main surface of the n-InP substrate 12 is a (001) surface.

Reference numeral 14 denotes an n-InP buffer layer disposed on the n-InP substrate 12, while 16 denotes an n-InGaAsP diffraction grating layer disposed on the n-InP buffer layer. Through-holes 16a, as a concave shape, which have a strip-shaped opening extending in a direction perpendicular to the optical waveguide direction are arranged alongside of each other at intervals of, for example, 100 nm in the direction of the optical waveguide. The diffraction grating layer 16 is any material that can achieve lattice matching to InP and has a refractive index different from that of InP.

Reference numeral 18 denotes an n-InP burying layer that fills the through holes 16a in the diffraction grating layer 16 and contains S as an added impurity at a concentration of, for example, $1 \times 10^{19}$ cm$^{-3}$ or more. The through holes 16a are filled with the n-InP burying layer 18 such that the surface of the n-InP burying layer 18 is approximately at the same level as that of the upper surface of the diffraction grating layer 16. The refractive index of the diffraction grating layer 16 is larger than that of the n-InP burying layer 18, and each portion of the diffraction grating layer 16 and each portion of the n-InP burying layer 18 are disposed alternately at a pitch of, for example, 100 nm in the optical waveguide direction, thereby forming a diffraction grating 19.

Reference numeral 20 denotes an n-InP cladding layer which is a first cladding layer disposed such that it covers the n-InP burying layer 18 and the diffraction grating layer 16.

Reference numeral 22 denotes an active layer having a multiple quantum well structure made up of an InGaAsP quantum well layer and an InGaAsP barrier layer.

When the diffraction grating 19 is formed under the active layer 22, which is the active region of the laser, the n-InP cladding layer 20 is formed such that its thickness is, for example, approximately between 0.1 and 0.3 μm in order to increase the coupling coefficient kL of the diffraction grating 19.

Reference numeral 24 denotes a p-InP cladding layer which is a second cladding layer disposed on the active layer 22.

The n-InP buffer layer 14, the diffraction grating 19 made up of the diffraction grating layer 16 and the n-InP burying layer 18, the n-InP cladding layer 20, the active layer 22, and the lower layer 24a of the p-InP cladding layer 24 disposed on the active layer 22 collectively form a ridge which has a width of approximately 5 μm and extends in the optical waveguide direction. On both sides of the ridge are laminated an Fe-InP blocking layer 26 and an n-InP blocking layer 28 on the Fe-InP blocking layer 26, which form collectively a current constriction structure such that the drive current can efficiently flow through the active layer 22 in the ridge.

The upper layer 24b of the p-InP cladding layer 24 is laminated such that it covers the lower layer 24a of the p-InP cladding layer 24 in the ridge and the n-InP blocking layer 28 on both sides of the ridge. Reference numeral 30 denotes a p-InGaAs contact layer disposed on the p-InP cladding layer 24. Both the p-InP cladding layer 24 and the p-InGaAs contact layer 30 contain Zn as an added impurity of p type. Reference numeral 32 denotes a p type electrode disposed on the surface of the contact layer 30, while 34 denotes an n type electrode disposed on the rear surface of the n-InP substrate 12.

The manufacturing method will be described below.

FIGS. 4 to 12 are each a cross-sectional view of a semiconductor laser in a manufacturing process employed by a manufacturing method of a semiconductor laser according to the present invention.

FIGS. 4 to 7 are each a cross-sectional view of the same cross section as that shown in FIG. 1, while FIGS. 8 to 12 are each a cross-sectional view of the same cross section as that shown in FIG. 2.

Figure 4:
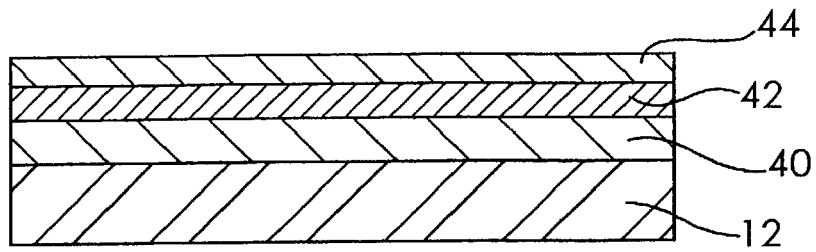
FIGS. 4 to 12 are each a cross-sectional view of a semiconductor laser in a manufacturing process employed by a manufacturing method of a semiconductor laser according to one embodiment of the present invention.

Referring to FIG. 4, on the n-InP substrate 12 and by use of the MOCVD method, etc., the manufacturing method sequentially forms: an n-InP layer 40 corresponding to the n-InP buffer layer 14 (in FIG. 1); an n-InGaAsP layer 42 corresponding to the diffraction grating layer 16; and the n-InP capping layer 44. These layers contain S as an added impurity at a concentration of, for example, approximately $1 \times 10^{18}$ cm$^{-3}$. FIG. 4 shows a cross section of the semiconductor laser (chip) after it is subjected to this manufacturing process.

Figure 5:
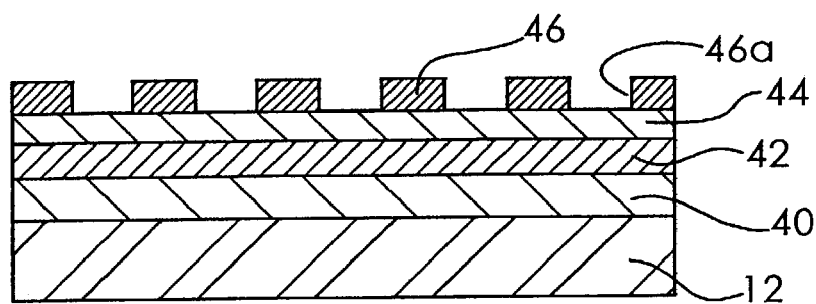

Then, referring to FIG. 5, after a photoresist is coated on the capping layer 44, a resist pattern 46 having strip-shaped opening portions 46a at appropriate intervals (for example, 100 nm) in a direction perpendicular to the optical waveguide direction is formed by use of a photolithographic technique. FIG. 5 shows a cross section of the semiconductor laser (chip) after it is subjected to this manufacturing process.

Figure 6:
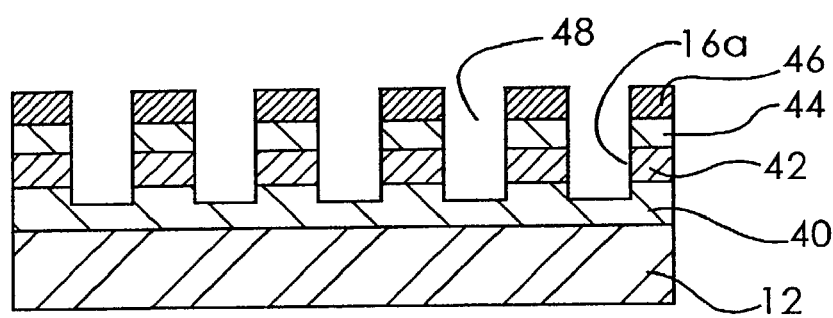

Then, referring to FIG. 6, the capping layer 44 and the n-InGaAsP layer 42 are etched by RIE, etc. using the resist pattern 46 as a mask to form concave portions 48 in which the through holes 16a are formed in the n-InGaAsP layer 42. The stripe pattern formed of the capping layer 44, the n-InGaAsP layer 42, and the concave portions 48 has a pitch of 100 nm. Subsequently, the resist pattern 46 is removed. FIG. 6 shows a cross section of the semiconductor laser (chip) after it is subjected to this manufacturing process.

Figure 7:
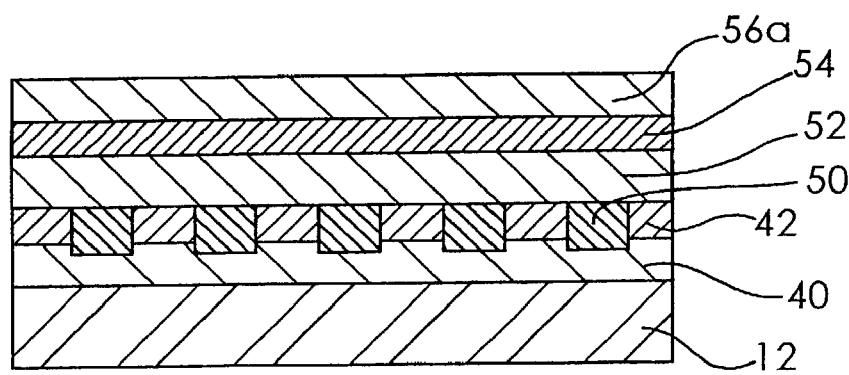

After that, referring to FIG. 7, the opening portions 16a in the n-InGaAsP layer 42 are filled with an n-InP layer 50 (corresponding to the n-InP burying layer 18) added with S as a VI family element impurity at a concentration of, for example, $1 \times 10^{19}$ cm$^{-3}$ or more such that the surface of the n-InP layer 50 is approximately at the same level as that of the upper surface of the n-InGaAsP layer 42.

Furthermore, an n-InP layer 52 corresponding to the n-InP cladding layer 20 is crystal-grown to cover the capping layer 44 and the n-InP layer 50 corresponding to the n-TnP burying layer 18. The n-InP layer 52 contains S as an added impurity at a concentration of, for example, approximately $1 \times 10^{18}$ cm$^{-1}$.

Subsequently, a multiple quantum well layer 54 (corresponding to the active layer 22) made up of an InGaAsP quantum well layer and an InGaAsP barrier layer, and a p-InP layer 56a corresponding to the p-InP cladding layer 24 are laminated on the surface of the n-InP layer 52. FIG. 7 shows a cross section of the semiconductor laser (chip) after it is subjected to this manufacturing process.

When crystal-growing the n-InP layer 50, the initial growth temperature is set to a little lower than an ordinary InP crystal growth temperature of, for example, 600° C., and then the growth temperature is gradually increased to the ordinary growth temperature. This is because if the layer is crystal-grown at the growth temperature 600° C. from the start, the original shape of the through holes 16a in the n-InGaAsP layer 42 may not be maintained, resulting in deformation of the through holes 16a. To prevent this from happening, the crystal growth is started at a temperature lower than an ordinary growth temperature, and then the temperature is increased to the ordinary growth temperature.

A deformed diffraction grating means that it cannot sufficiently exhibit its inherent optical characteristics, resulting in failure to fully obtain the element characteristics of the DFB laser. The above arrangement is made to avoid this problem.

It should be noted that since the addition process of S is not affected by the growth temperature as much as that of Zn, a variation in the temperature does not affect the concentration of the added impurity very much. Therefore, the control of the growth temperature may be a little rough.

The stripe pattern formed of the capping layer 44, the n-InGaAsP layer 42, and the concave portions 48 has a pitch of 0.1 μm.

When forming an n-InP layer on a wafer through a pattern with such a dimension formed on the wafer, if the concentration of S added to the n-InP layer is set to $1 \times 10^{19}$ cm$^{-3}$ or more, the growth of the crystal growth layer is initiated selectively from the concave portions 48, and then the growth proceeds such that the surfaces of the capping layer 44 and the n-InGaAsP layer 42 and the uppermost surfaces of the crystal growth layer in the concave portions 48 form a flat surface.

As a result, even if the surface of the capping layer 44 and the uppermost surfaces of the crystal growth layer in the concave portions 48 have some irregularity, the surface of the n-InP layer 52 becomes sufficiently flat after its crystal growth. Therefore, the multiple quantum well layer 54 formed on the n-InP layer 52 also becomes flat and does not undulate in the optical waveguide direction, making it possible to form the active layer 22 having predetermined characteristics and prevent occurrence of crystal dislocation in the n-InP layer 52.

With this arrangement, the n-InP layer 52 can be formed to have a thickness of, for example, approximately between 0.1 and 0.3 μm, or even less than 0.1 μm, making it possible to increase the coupling coefficient kL of the diffraction grating 19.

Figure 8:
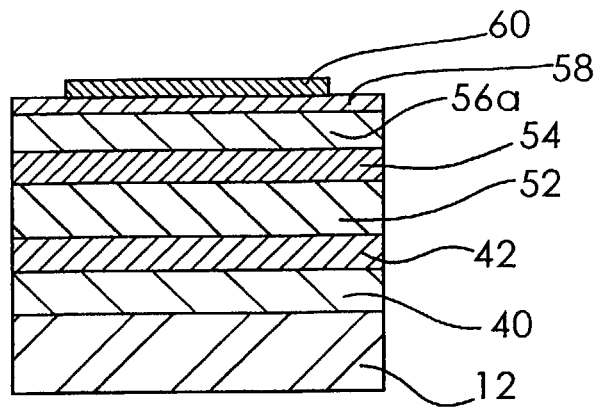

Then, referring to FIG. 8, an SiO$_2$ film 58 is formed on the p-InP layer 56a and coated with a photoresist on the SiO$_2$ film 58. Subsequently, by use of a photolithographic technique, a strip-shaped resist pattern 60 is formed which extends in the optical waveguide direction and which has a width of 5 μm in a direction perpendicular to the optical waveguide direction. FIG. 8 shows a cross section of the semiconductor laser (chip) after it is subjected to this manufacturing process.

Figure 9:
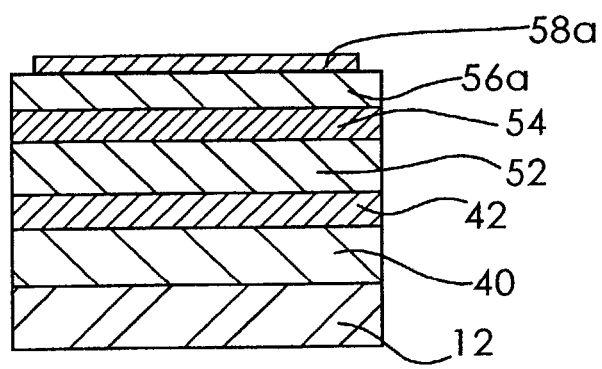

Then, referring to FIG. 9, the SiO$_2$ film 58 is etched by RIE using the resist pattern 60 as a mask to form an SiO$_2$ film pattern 58a. After the formation of the SiO$_2$ film pattern 58a, the resist pattern 60 is removed. FIG. 9 shows a cross section of the semiconductor laser (chip) after it is subjected to this manufacturing process.

Figure 10:
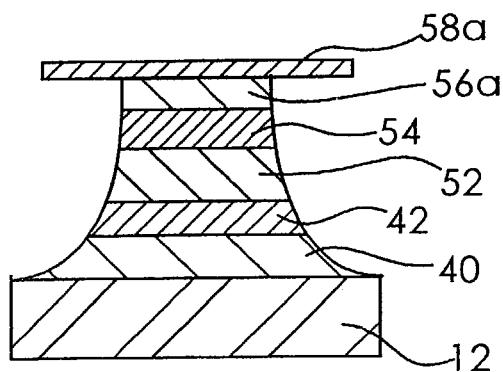

Then, referring to FIG. 10, by use of a wet etchant such as HBr, wet etching is carried out which reaches the n-InP layer 40 through the multiple quantum well layer 54 (for example, wet etching having a depth of approximately 3.5 μm) using the SiO$_2$ film pattern 58a as a mask to form a mesa structure for confining electric current within the active layer 22. FIG. 10 shows a cross section of the semiconductor laser (chip) after it is subjected to this manufacturing process.

Figure 11:
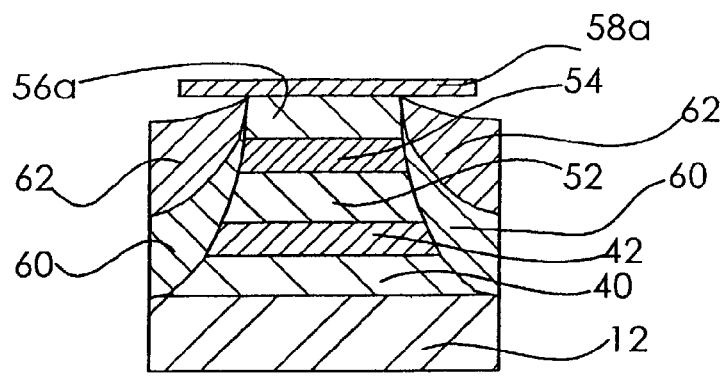

Then, referring to FIG. 11, an Fe-InP layer 60 and an n-InP layer 62 are formed using the SiO$_2$ film pattern 58a as a mask. Since the SiO$_2$ film pattern 58a has selectivity against InP, the Fe-InP layer 60 and the n-InP layer 62 are not formed on the SiO$_2$ film pattern 58a. Thus, the SiO$_2$ film pattern 58a functions as a selective growth mask such that the Fe-InP layer 60 and the n-InP layer 62 are laminated only around the mesa structure, forming a current constriction structure around it. FIG. 11 shows a cross section of the semiconductor laser (chip) after it is subjected to this manufacturing process.

Figure 12:
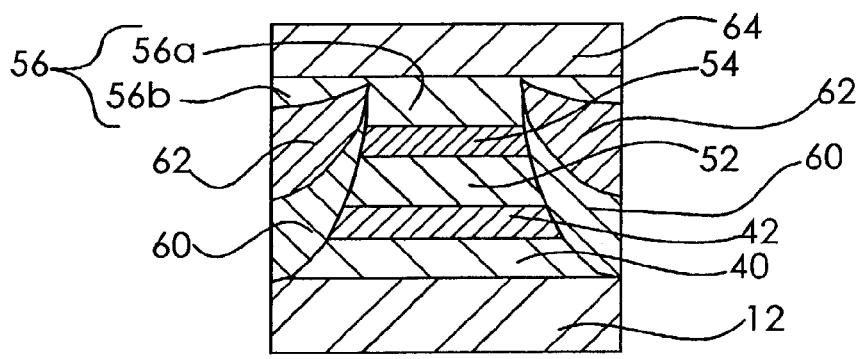

Then, referring to FIG. 12, the SiO$_2$ film pattern 58a is removed using a wet etchant such as HF. Furthermore, after a p-InP layer 56b corresponding to the upper layer 24b of the p-InP cladding layer 24 is laminated, a p-InGaAs layer 64 corresponding to the contact layer 30 is formed. FIG. 12 shows a cross section of the semiconductor laser (chip) after it is subjected to this manufacturing process.

In addition, the p type electrode 32 and the n type electrode 34 are formed, completing the semiconductor laser 10 shown in FIGS. 1 to 3.

In the DFB laser 10 configured as described above, since the through holes 16a of the diffraction grating layer 16 are filled with the n-InP layer 50 which corresponds to the n-InP burying layer 18 and contains S at a high concentration, the crystal growth proceeds such that the through holes 16a are filled up first.

Therefore, the n-InP layer 52, which corresponds to the n-InP cladding layer 20 and which is formed on the through holes 16a, etc., can be formed such that the n-InP layer 52 has a flat surface and includes only a small number of lattice defects even when the layer is thin.

Furthermore, the initial growth temperature of the n-InP layer 50 corresponding to the n-InP burying layer 18 can be set lower than that of the n-InP cladding layer 20 to prevent deformation of the through holes 16a of the diffraction grating layer 16. Since the concentration of the impurity S is not affected by the growth temperature as much as that of Zn and furthermore S does not diffuse as much as Zn, S does not affect the characteristics of the active layer 22, whatever its concentration.

The n-InP layer 52 corresponding to the n-InP cladding layer 20 has a flat surface. Therefore, the multiple quantum well layer 54 corresponding to the active layer 22 is also formed to be flat on the n-InP layer 52. It does not undulate in the optical waveguide direction.

Thus, the diffraction grating can be formed into a shape with high precision so as to have good optical characteristics, making it possible to form a thin n-InP cladding layer between the diffraction grating layer and the active layer, resulting in a large coupling coefficient kL. Accordingly, the above arrangement can lead to a DFB laser having good light emitting characteristics.

Furthermore, since the active layer is formed to be flat, it is possible to enhance the element characteristics of the laser.

The DFB laser device of the present embodiment described above can be configured such that it includes a diffraction grating having a high coupling coefficient and a DFB laser having good laser element characteristics. In addition, this DFB laser, which has the good element characteristics, can be manufactured in a simple process.

Thus, it is possible to provide a semiconductor laser device having good laser element characteristics at low cost.

Second Embodiment

Figure 13:
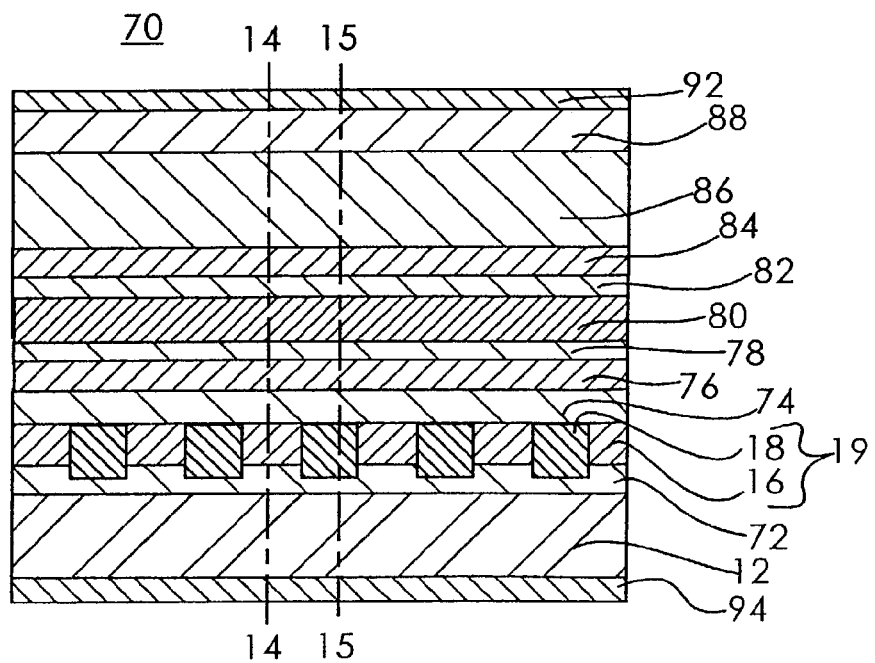
FIG. 13 is a cross-sectional view of a semiconductor laser according to another embodiment of the present invention.
Figure 14:
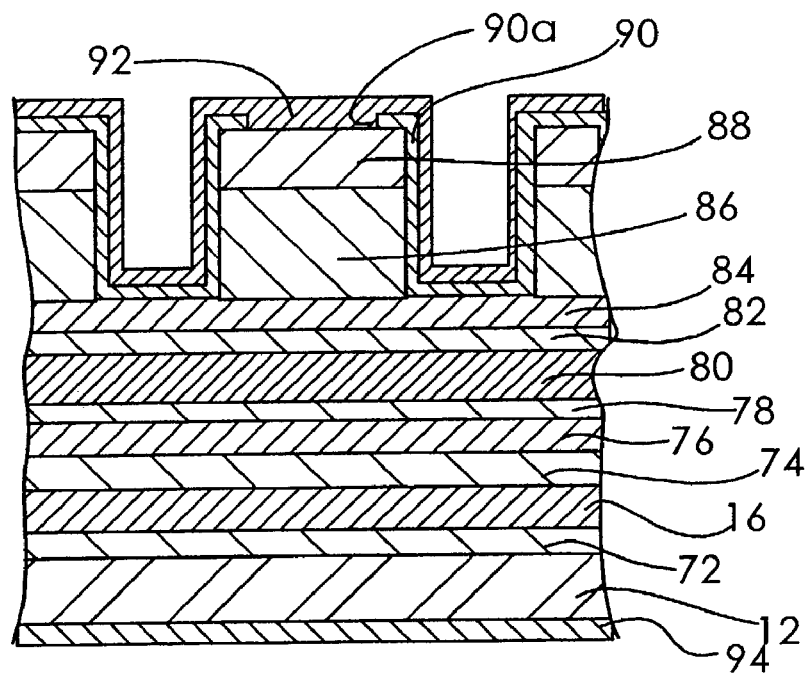
FIG. 14 is a cross-sectional view of the semiconductor laser of FIG. 13 taken along line 14—14.
Figure 15:
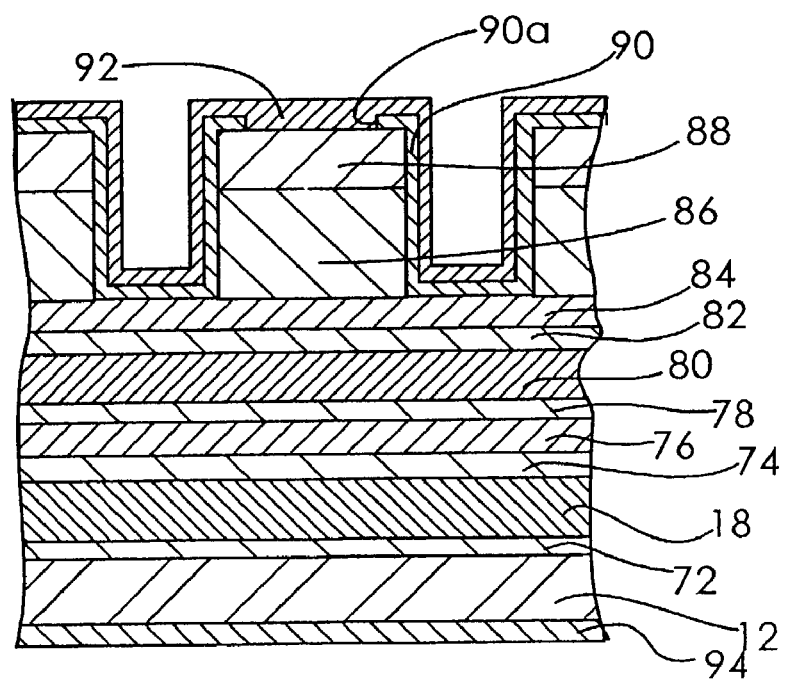
FIG. 15 is a cross-sectional view of the semiconductor laser of FIG. 13 taken along line 15—15.
Figure 16:
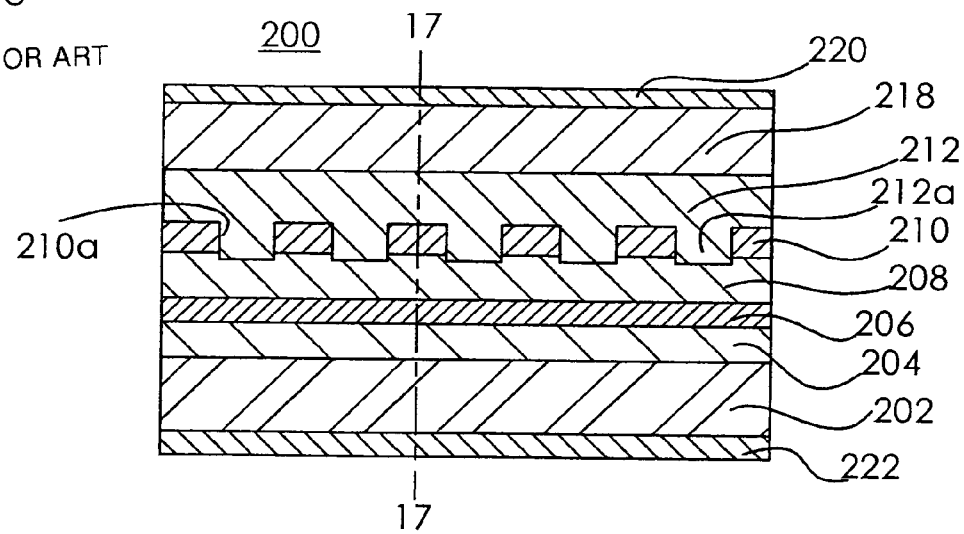
FIG. 16 is a cross-sectional view of a conventional DFB laser.
Figure 17:
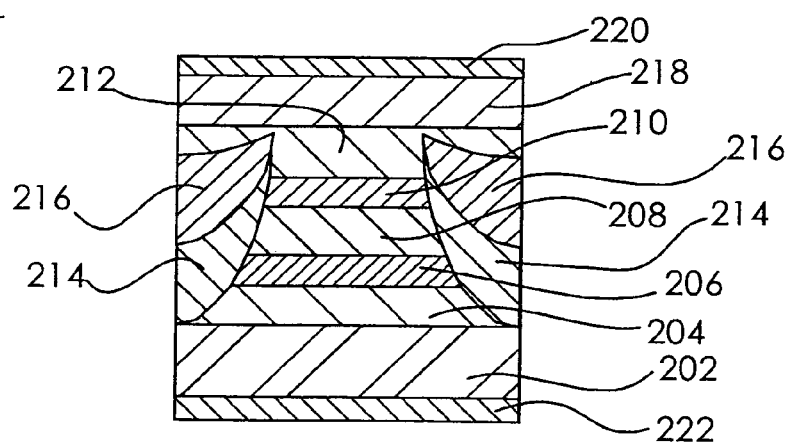
FIG. 17 is a cross-sectional view of the DFB laser of FIG. 16 taken along line 17—17.
Figure 18:
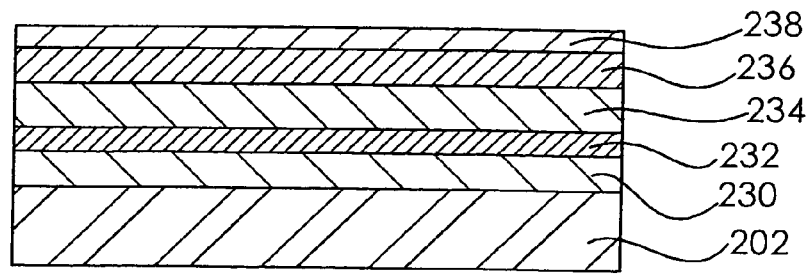
FIGS. 18 to 25 are each a cross-sectional view of a semiconductor laser in a manufacturing process employed by a manufacturing method of a conventional semiconductor laser.
Figure 19:
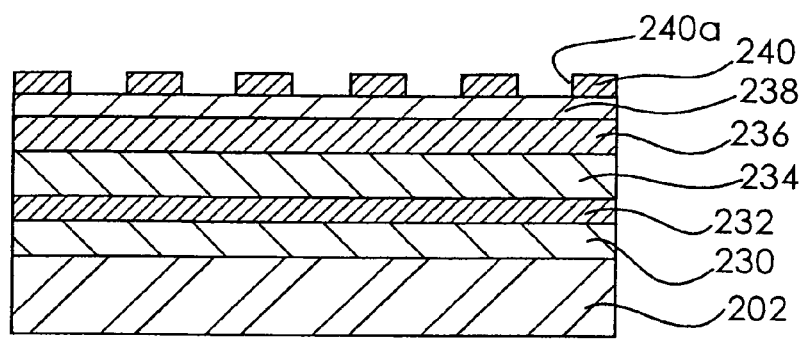
Figure 20:
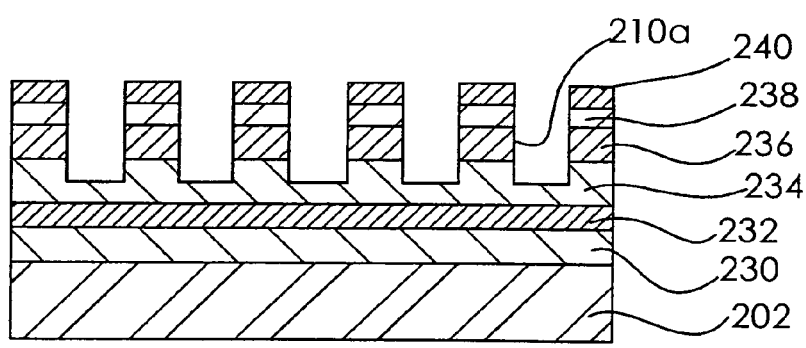
Figure 21:
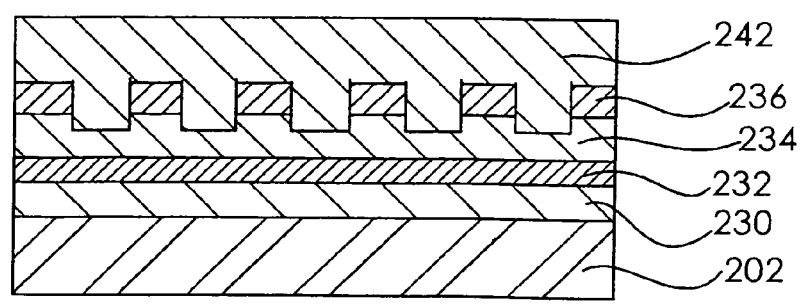
Figure 22:
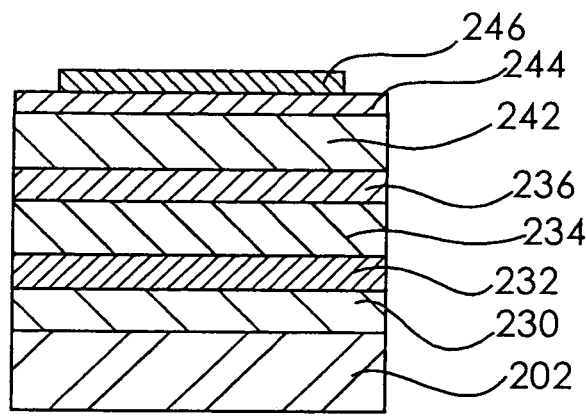
Figure 23:
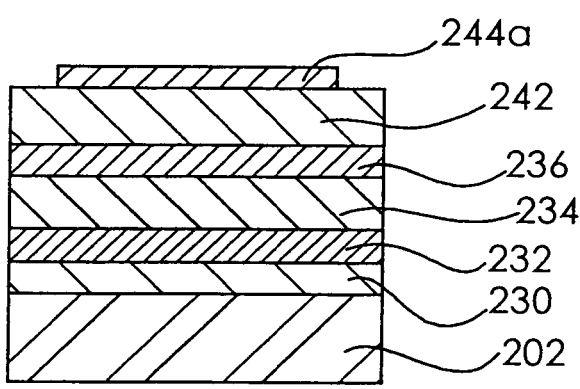
Figure 24:
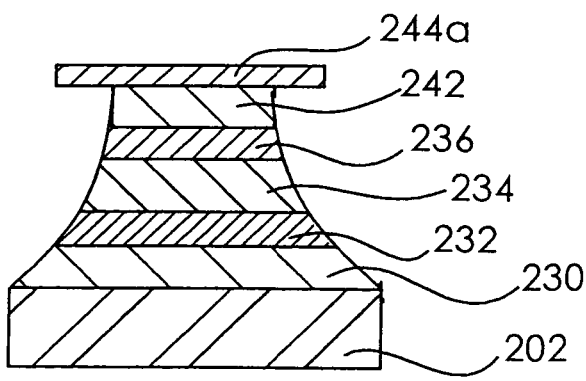
Figure 25:
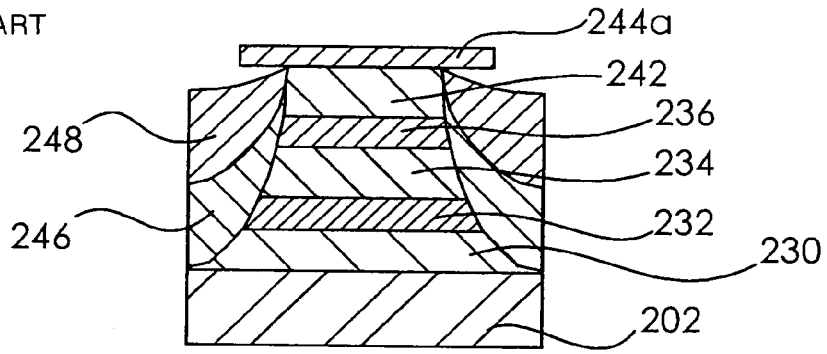
Figure 26:
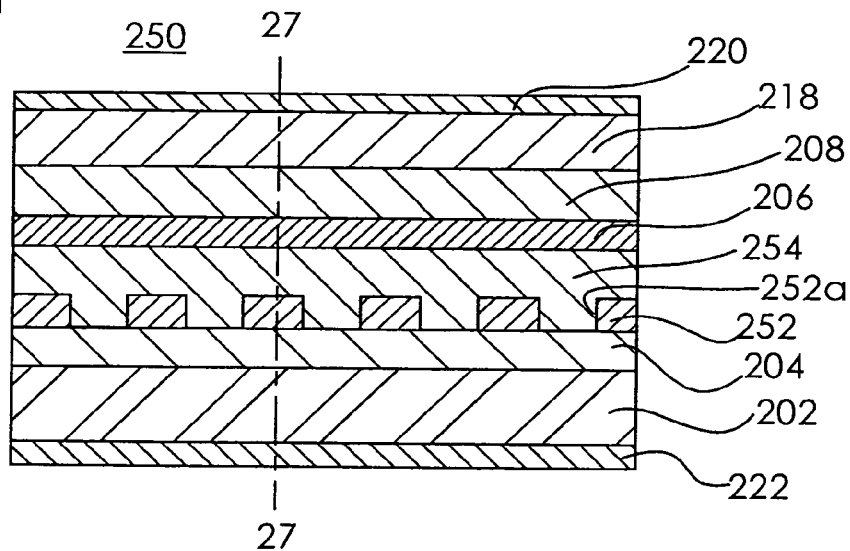
FIG. 26 is a cross-sectional view of another conventional DFB laser.
Figure 27:
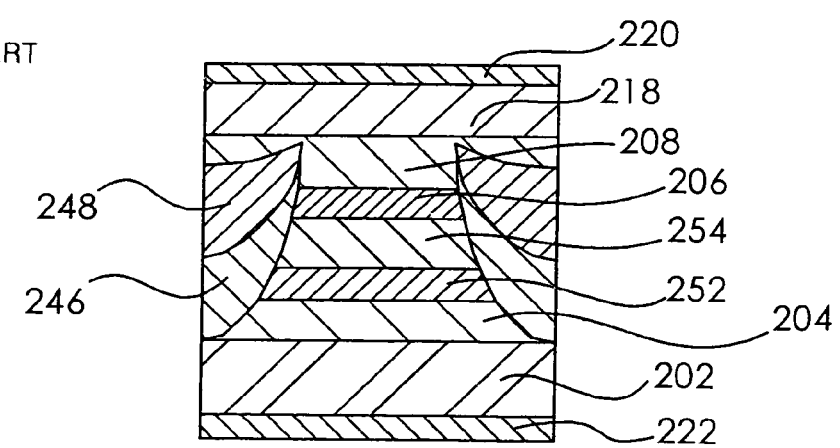
FIG. 27 is a cross-sectional view of the DFB laser of FIG. 26 taken along line 27—27.

FIG. 13 is a cross-sectional view of a semiconductor laser according to a second embodiment of the present invention. In FIG. 13, the optical waveguide direction is parallel to the right and left sides of the paper. FIG. 14 is a cross-sectional view of the semiconductor laser of FIG. 13 taken along line 14—14, while FIG. 15 is a cross-sectional view of the semiconductor laser of FIG. 13 taken along line 15—15. In FIGS. 14 and 15, the optical waveguide direction is normal to the paper.

In FIGS. 13 to 15, reference numeral 70 denotes a DFB laser. Reference numeral 72 denotes a first n-InP cladding layer disposed on the n-InP substrate 12. The diffraction grating layer 16 is disposed on the first n-InP cladding layer 72.

The diffraction grating layer 16 of the present embodiment has a thickness of approximately 80 nm, which is thicker than that for the first embodiment. The diffraction grating layer 16 is made thick because when an AlGaInAs quantum well layer is used, good light emitting characteristics cannot be obtained without increasing the coupling coefficient kL of the diffraction grating.

Reference numeral 74 denotes a second n-InP cladding layer disposed on both the diffraction grating layer 16 and the n-InP burying layer 18. The sum of the thicknesses of the first n-InP cladding layer 72, the diffraction grating layer 16, and the second n-InP cladding layer 74 is approximately 1 µm.

Reference numeral 76 denotes an n-AlInAs cladding layer with a thickness of approximately 0.1 µm disposed on the second n-InP cladding layer 74. In the DFB laser 70, the second n-InP cladding layer 74 and the n-AlInAs cladding layer 76 collectively constitute a first cladding layer of n type. Setting the thickness of the first cladding layer of n type to 0.1 µm or smaller can increase the coupling coefficient kL of the diffraction grating.

Reference numeral 78 denotes a light confining n-AlGaInAs layer with a thickness of 0.1 µm disposed on the n-AlInAs cladding layer 76. Reference numeral 80 denotes an active layer which is disposed on the light confining n-AlGaInAs layer 78 and has a quantum well structure made up of an AlGaInAs quantum well layer and an AlGaInAs barrier layer. Reference numeral 82 denotes a light confining p-AlGaInAs layer with a thickness of 0.1 µm disposed on the active layer 80.

Reference numeral 84 denotes a p-AlInAs cladding layer with a thickness of 0.1 µm disposed on the light confining p-AlGaInAs layer 82. Reference numeral 86 denotes a p-InP cladding layer with a thickness of 1.5 µm disposed on the p-AlInAs cladding layer 84. In the DFB laser 70, the p-AlInAs cladding layer 84 and the p-InP cladding layer 86 collectively constitute a second cladding layer of p type.

Reference numeral 88 denotes a p-InGaAs contact layer with a thickness of 0.1 µm disposed on the p-InP cladding layer 86. The p-InP cladding layer 86 and the p-InGaAs contact layer 88 are formed in a ridge shape.

The first n-InP cladding layer 72, the second n-InP cladding layer 74, the n-AlInAs cladding layer 76, and the light confining n-AlGaInAs layer 78 each contain S as an added impurity at a concentration of $1 \times 10^{18}$ cm$^{-3}$.

The type of impurity added to the diffraction grating layer 16 and the n-InP burying layer 18 and its concentration are the same as those in the first embodiment.

The light confining p-AlGaInAs layer 82, the p-AlInAs cladding layer 84, and the p-InP cladding layer 86 each contain Zn as an added impurity at a concentration of $1 \times 10^{18}$ cm$^{-3}$. The p-InGaAs contact layer 88 contains Zn as an added impurity at a concentration of $1 \times 10^{19}$ cm$^{-1}$.

Reference numeral 90 denotes an SiO$_2$ insulating film disposed on the surface of the element, and 92 denotes a p type electrode of Ti/Au disposed on the SiO$_2$ insulating film 90. The p type electrode 92 is electrically connected to the p-InGaAs contact layer 88 through opening portions 90a provided in the SiO$_2$ insulating film 90. Reference numeral 94 denotes an n type electrode of Au/Ge/Ni/Au disposed on the rear surface of the n-InP substrate 12.

In the manufacturing method of the DFB laser 70, the diffraction grating 19 formed of the diffraction grating layer 16 and the n-InP burying layer 18 is manufactured by use of the same method as that employed by the first embodiment.

On the n-InP substrate 12 and by use of the MOCVD method, etc., the manufacturing method sequentially forms:

the first n-InP cladding layer 72, the n-InGaAsP layer corresponding to the diffraction grating layer 16, and the n-InP capping layer.

Then, after a photoresist is coated on the capping layer, a resist pattern having opening portions at appropriate intervals (for example, 100 nm) is formed by use of a photolithographic technique.

Then, the capping layer and the n-InGaAsP layer are etched by RIE, etc. using the resist pattern as a mask to form concave portions. After that, the resist pattern is removed.

Then, the through holes in the n-InGaAsP layer 16 are filled with the n-InP layer 18 added with S as an impurity at a concentration of $1\times10^{19}$ cm$^{-3}$ such that the surface of the n-InP layer 18 is approximately at the same level as that of the upper surface of the n-InGaAsP layer 16.

When crystal-growing the n-InP layer 18, the initial growth temperature is set to a little lower than an ordinary n-InP crystal growth temperature of, for example, 600° C., and then the growth temperature is gradually increased to the ordinary growth temperature. This is because if the layer is crystal-grown at the growth temperature 600° C. from the start, the original shape of the through holes 16a in the n-InGaAsP layer 16 may not be maintained, resulting in deformation of the through holes 16a. To prevent this from happening, the crystal growth is started at a temperature lower than an ordinary growth temperature, and then the temperature is increased to the ordinary growth temperature.

Subsequently, the manufacturing method sequentially forms: the second n-InP cladding layer 74; the n-AlInAs cladding layer 76; the light confining n-AlGaInAs layer; the active layer having the quantum well structure made up of the AlGaInAs quantum well layer and the AlGaInAs barrier layer; the light confining p-AlGaInAs layer 82; the p-AlInAs cladding layer 84; the p-InP cladding layer 86; and the p-InGaAs contact layer 88.

Then, ridge etching is carried out to form an optical waveguide ridge; an SiO$_2$ insulating film is formed on the surface of the element; the opening 90a is formed on the optical waveguide ridge; the p type electrode 92 is formed and electrically connected to the p-InGaAs contact layer 88; and the n type electrode 94 is formed on the rear surface of the n-InP substrate.

Especially, in the DFB laser 70 of the second embodiment, the active layer 80 is formed to have an AlGaInAs quantum well structure. An AlGaInAs quantum well has a large ΔEc value and therefore there is a low possibility that carriers overflow, enhancing the temperature characteristics of the laser diode. Furthermore, since both the differential gain and the relaxation oscillation frequency fr are high, the laser diode has enhanced high-speed characteristics.

However, good light emitting characteristics cannot be obtained unless the coupling coefficient kL of the diffraction grating is set to a large value. To do this, it is necessary to make thicker the thickness of the diffraction grating made up of the diffraction grating layer 16 and the n-InP burying layer 18 and reduce the distance between the diffraction grating layer and the active layer as much as possible, for example, to 0.1 μm or less. Increasing the coupling coefficient kL of the diffraction grating enhances the light emitting characteristics of the DFB laser as well as increasing the degree of freedom for designing the element.

In the DFB laser 70 of the second embodiment, each portion of the diffraction grating layer 16 and each portion of the n-InP burying layer 18 are disposed at a pitch of 100 nm. The diffraction grating layer has a thickness of 80 nm, and the through holes 16a having a concave shape also have a thickness equivalent to that.

When forming the n-InP burying layer 18 in the concave portions of the diffraction grating layer 16 patterned at a pitch of 100 nm, if the concentration of S added to the n-InP burying layer 18 is set to, for example, $1\times10^{19}$ cm$^{-3}$ or more, the growth of the crystal growth layer is initiated selectively from the concave portions including the through holes 16a, and then the growth proceeds such that the surface of the n-InGaAsP layer constituting the diffraction grating layer 16 and the uppermost surfaces of crystal growth layer in the through holes 16a form a flat surface.

As a result, even if the surface of the n-InGaAsP layer constituting the diffraction grating 16 and the uppermost surface of the n-InP burying layer 18 in the through holes 16a have some irregularity, the surface of the second n-InP cladding layer 74 becomes sufficiently flat after the crystal growth of the second n-InP cladding layer 74.

Therefore, the multiple quantum well layer 54 is formed to be flat on the flat surface of the InP cladding layer 74 through the n-AlInAs cladding layer 76 and the light confining n-AlGaInAs layer 78 while keeping a high coupling coefficient of the diffraction grating.

As described above, a diffraction grating having a large coupling coefficient kL must be employed in DFB lasers in which the active layer has an AlGaInAs quantum well structure and the diffraction grating is formed in the n side semiconductor layer. To do this, it is necessary to increase the thickness of the diffraction grating layer and reduce the distance between the diffraction grating and the active layer. However, if a thick diffraction grating layer is employed when the through holes in the diffraction grating layer are filled in by crystal growth, the resultant crystal growth surface may not be flat occasionally.

To cope with this problem, in the DFB laser of the second embodiment, an InGaAsP layer is formed as the diffraction grating layer, and an n-InP layer added with S as an impurity at a concentration of $1\times10^{19}$ cm$^{-3}$ or more is used as the burying layer for burying the through holes of the diffraction grating layer through "burying growth". With this arrangement, the crystal growth is initiated selectively from the through holes 16a, and then the growth proceeds such that the surface of the n-InGaAsP layer (diffraction grating layer) and the uppermost surfaces of the crystal growth in the through holes 16a form a flat surface.

Therefore, even with a thick diffraction grating, the surfaces of the diffraction grating layer and the n-InP cladding layer can be formed to have a flat surface after crystal growth. Furthermore, the active layer can be configured such that it does not undulate and is flat even when the distance between the diffraction grating layer and the active layer is reduced. As a result, it is possible to obtain a DFB laser employing an active layer which has an AlGaInAs quantum well structure exhibiting good characteristics while maintaining a high coupling coefficient of the diffraction grating.

Further, since the coupling coefficient kL of the diffraction grating can be increased, it is possible to enhance the degree of freedom for designing a DFB laser, resulting in a DFB laser which provides a high degree of flexibility and high yield. Accordingly, it is possible to obtain a DFB laser having good laser characteristics for optical communications at low cost.

It should be noted that even through the above description explained a DFB laser or a DFB laser with a modulator for communications, it goes without saying that the effect of the above laser can also be produced by a DFB laser in which a diffraction grating is provided on the n side and an active layer is formed over the diffraction grating.

Configured as described above, the semiconductor lasers of the present invention have the following effects.

A semiconductor laser device of the present invention comprises: an n type InP substrate; a diffraction grating layer of an n type formed on a surface of the InP substrate and made of a material which can provide lattice matching to InP and which has a refractive index different from that of InP, the n type diffraction grating layer having concave portions periodically disposed alongside of one another in a laser optical waveguide direction; an InP layer of an n type containing a VI family element as an impurity at a concentration of $1 \times 10^{19}$ cm$^{-3}$ or more and disposed such that the concave portions are buried in the InP layer; a first cladding layer of an n type disposed on both the InP layer and the diffraction grating layer; an active layer disposed on the first cladding layer; and a second cladding layer of a p type disposed on the active layer. Thus, the concave portions in the diffraction grating layer are buried in the n type InP layer, which flattens the surface of the first cladding layer, making it possible to configure the active layer such that it exhibits a reduced number of occurrences of crystal dislocation and good optical characteristics. As a result, it is possible to provide a semiconductor laser device having good laser element characteristics.

Further, in the semiconductor laser device, the concave portions of the diffraction grating layer are formed of through-holes formed in the diffraction grating layer and a surface of a layer under the diffraction grating layer. With this arrangement, the diffraction grating can be configured such that it has a high coupling coefficient and exhibits only small variations in the optical characteristics. Therefore, a semiconductor laser device which provides high yield can be configured, making it possible to provide a semiconductor laser device having good laser characteristics at low cost.

Still further, in the semiconductor laser device, a distance between an upper interface surface of the diffraction grating layer and the active layer is 0.1 μm or less. With this arrangement, the semiconductor laser device can be configured such that the layer thickness of the first cladding layer is thin and the diffraction grating has a high coupling coefficient. As a result, it is possible to provide a semiconductor laser device having good laser element characteristics.

Still further, in the semiconductor laser device, the active layer has a quantum well structure including a quantum well layer formed of AlGaInAs. Thus, the active layer can be configured such that it has an AlGaInAs quantum well structure exhibiting good optical characteristics while maintaining a high coupling coefficient of the active layer to the diffraction grating. As a result, it is possible to provide a semiconductor laser device which is produced with high yield at low cost and which has good temperature characteristics and high-speed characteristics.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
   an n type InP substrate;
   an n type diffraction grating layer supported by said InP substrate, lattice matching with InP, and having a refractive index different from the refractive index of InP, said n type diffraction grating layer having concave portions periodically disposed alongside of one another in a laser optical waveguide direction;
   an n type InP layer containing a Group VI element as a dopant impurity in a concentration of at least $1 \times 10^{19}$ cm$^{-3}$ and filling the concave portions of said diffractive grating layer so that said InP layer and said diffraction grating layer have substantially co-planar surfaces;
   an n type first cladding layer disposed on the substantially co-planar surfaces of said InP layer and said diffraction grating layer;
   an active layer disposed on said first cladding layer; and
   a p type second cladding layer disposed on said active layer.

2. The semiconductor laser device according to claim 1, wherein the concave portions of said diffraction grating layer include through-holes in said diffraction grating layer and extending into a layer under said diffraction grating layer.

3. The semiconductor laser device according to claim 1, wherein said diffraction grating layer is separated from said active layer by no more than 0.1 μm.

4. The semiconductor laser device according to claim 1, wherein said active layer has a quantum well structure including a quantum well layer of AlGaInAs.

* * * * *